United States Patent
Lake (10) Patent No.: US 9,153,491 B2
(45) Date of Patent: *Oct. 6, 2015

(54) METHODS FOR FORMING CONDUCTIVE ELEMENTS AND VIAS ON SUBSTRATES AND FOR FORMING MULTI-CHIP MODULES

(71) Applicant: Micron Technology, Inc., Boise, ID (US)

(72) Inventor: Rickie C. Lake, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/483,510

(22) Filed: Sep. 11, 2014

(65) Prior Publication Data

US 2015/0031171 A1 Jan. 29, 2015

Related U.S. Application Data

(63) Continuation of application No. 13/430,167, filed on Mar. 26, 2012, now Pat. No. 8,835,293, which is a continuation of application No. 11/744,592, filed on May 4, 2007, now Pat. No. 8,183,151.

(51) Int. Cl.
*H01L 21/48* (2006.01)
*H01L 21/768* (2006.01)
(Continued)

(52) U.S. Cl.
CPC ........ *H01L 21/76898* (2013.01); *H01L 21/486* (2013.01); *H01L 21/76831* (2013.01); *H01L 23/481* (2013.01); *H01L 25/50* (2013.01); H01L 2224/0401 (2013.01); H01L 2224/05009 (2013.01); H01L 2224/131 (2013.01); H01L 2224/13025 (2013.01); H01L 2224/16146 (2013.01); H01L 2924/12044 (2013.01); Y10T 156/10 (2015.01)

(58) Field of Classification Search
CPC ................... H01L 21/76897; H01L 21/76831; H01L 21/76814; H01L 21/10855; H01L 21/10894
USPC .......................... 438/586, 629, 639, 667, 700
See application file for complete search history.

(56) References Cited

U.S. PATENT DOCUMENTS 6,143,396 A 11/2000 Saran et al.
6,323,436 B1 11/2001 Hedrick et al.
(Continued)

FOREIGN PATENT DOCUMENTS

EP 1662564 A1 5/2006

OTHER PUBLICATIONS

International Search Report for International Application No. PCT/US2008/062487 mailed Jul. 18, 2008, 4 pages.
(Continued)

*Primary Examiner* — Michael Lebentritt
(74) *Attorney, Agent, or Firm* — TraskBritt (57) ABSTRACT

Methods of forming conductive elements on and in a substrate include forming a layer of conductive material over a surface of a substrate prior to forming a plurality of vias through the substrate from an opposing surface of the substrate to the layer of conductive material. In some embodiments, a temporary carrier may be secured to the layer of conductive material on a side thereof opposite the substrate prior to forming the vias. Structures, including workpieces formed using such methods, are also disclosed.

20 Claims, 6 Drawing Sheets (51) Int. Cl.
*H01L 23/48* (2006.01)
*H01L 25/00* (2006.01)

(56) References Cited

U.S. PATENT DOCUMENTS

| | | | |
|---|---|---|---|
| 6,498,503 B2 * | 12/2002 | Akram et al. | 324/750.05 |
| 6,661,041 B2 | 12/2003 | Keeth | |
| 6,680,545 B2 | 1/2004 | Young et al. | |
| 6,696,359 B1 | 2/2004 | Ireland | |
| 6,841,883 B1 | 1/2005 | Farnworth et al. | |
| 6,867,498 B2 | 3/2005 | Ireland | |
| 6,998,717 B2 | 2/2006 | Farnworth et al. | |
| 7,060,526 B2 | 6/2006 | Farnworth et al. | |
| 7,109,068 B2 | 9/2006 | Akram et al. | |
| 7,485,559 B2 * | 2/2009 | Cho et al. | 438/597 |
| 7,517,798 B2 | 4/2009 | Tuttle | |
| 7,795,134 B2 | 9/2010 | Sulfridge | |
| 8,183,151 B2 * | 5/2012 | Lake | 438/637 |
| 8,282,846 B2 * | 10/2012 | Hill | 216/46 |
| 8,603,918 B2 * | 12/2013 | Mueller et al. | 438/700 |
| 2001/0006257 A1 | 7/2001 | Shih et al. | |
| 2001/0034081 A1 | 10/2001 | Shimada | |
| 2002/0030267 A1 | 3/2002 | Suzuki | |
| 2002/0078561 A1 | 6/2002 | Jamil | |
| 2006/0043569 A1 | 3/2006 | Benson et al. | |
| 2006/0055050 A1 | 3/2006 | Numata et al. | |
| 2006/0289968 A1 | 12/2006 | Sulfridge | |
| 2006/0290001 A1 | 12/2006 | Sulfridge | |
| 2007/0048969 A1 | 3/2007 | Kwon et al. | |
| 2007/0048994 A1 | 3/2007 | Tuttle | |
| 2008/0272497 A1 | 11/2008 | Lake | |
| 2012/0175341 A1 | 7/2012 | Lake | |

OTHER PUBLICATIONS

International Written Opinion for International Application No. PCT/US2008/062487 mailed Jul. 18, 2008, 8 pages.

International Preliminary Report on Patentability for International Application No. PCT/US2008/062487 dated Nov. 10, 2009, 9 pages.

* cited by examiner

METHODS FOR FORMING CONDUCTIVE ELEMENTS AND VIAS ON SUBSTRATES AND FOR FORMING MULTI-CHIP MODULES

CROSS-REFERENCE TO RELATED APPLICATIONS

This application is a continuation of U.S. patent application Ser. No. 13/430,167, filed Mar. 26, 2012, now U.S. Pat. No. 8,835,293, issued Sep. 16, 2014, which application is a continuation of U.S. patent application Ser. No. 11/744,592, filed May 4, 2007, now U.S. Pat. No. 8,183,151, issued May 22, 2012, the disclosure of each of which is hereby incorporated herein in its entirety by this reference.

FIELD

Embodiments of the present invention relate to methods for forming conductive vias through substrates, such as semiconductor wafers or semiconductor dies. Embodiments of the present invention also relate to structures and assemblies that include such substrates and conductive vias.

BACKGROUND

Many different types of substrates are used for various purposes in the electronics industry. For example, integrated circuits are conventionally fabricated on semiconductor-type substrates to form semiconductor devices such as, for example, memory devices, imaging devices, and electronic signal processor devices (i.e., often referred to as microprocessors). Such semiconductor-type substrates include, for example, full or partial wafers of semiconductor materials such as silicon, germanium, gallium arsenide, indium phosphide, and other III-V- or II-VI-type semiconductor materials. Wafers include, for example, not only conventional wafers formed completely of a semiconductor material, but other substrates such as silicon-on-insulator (SOI)-type substrates, silicon-on-sapphire (SOS)-type substrates, and epitaxial layers of silicon supported by a layer of base material. Other types of substrates are used to form various other components and devices used in the electronics industry including, for example, circuit boards, contact cards, test carriers, package substrates, and interposer substrates. Such other types of substrates may comprise polymer materials, ceramic materials, metal materials, and composite materials, as well as a semiconductor material, usually silicon.

Substrates used in the electronics industry often carry conductive structures for communicating electrical signals and/or for providing electrical power to active elements of an electronic device. Such conductive structures include, for example, conductive traces (which conventionally extend in a generally horizontal direction relative to a major plane of the substrates), conductive vias (which conventionally extend in a generally vertical direction through at least a portion of the substrates), and conductive contact terminals (e.g., conductive pads) used for electrically interconnecting other conductive structures or devices to the conductive structures carried by the substrates.

It is often desirable to provide electrical communication through a substrate using the aforementioned conductive vias to electrically connect conductive traces and/or pads on one side of a substrate to conductive traces and/or pads on the opposing side of the substrate. As an example, two or more semiconductor devices (e.g., semiconductor dies or packages) may be stacked one on top of another to form a so-called "multi-chip module," which may be used to reduce the mounting area required on a circuit board for each of the semiconductor devices thereof. In such multi-chip modules, it is necessary to establish electrical communication between each of the semiconductor devices within the stack and the circuit board. Therefore, conductive vias may be formed entirely through one or more of the semiconductor devices to allow at least one other semiconductor device stacked thereover to communicate electrically with the circuit board through the conductive vias. As another example, the conductive contact terminals on a semiconductor device may be physically arranged in a pattern that does not correspond to a pattern of conductive contact terminals on a higher-level substrate to which it is desired to electrically connect the semiconductor device. Therefore, it may be necessary to effectively redistribute the conductive contact terminals of either the semiconductor device or the higher-level substrate to enable electrical contact to be established therebetween. A so-called "redistribution layer" is often used to effectively redistribute the conductive contact terminals on a semiconductor device. A redistribution layer includes conductive traces that each extends over a surface of a substrate from a first location to a second location at which another conductive contact terminal may be provided. The second location may correspond to, and be complementary with, a location of a conductive contact terminal on another element or device. Additionally, conductive vias may provide electrical communication to conductive regions on the back side of a semiconductor device to facilitate back-side probing. Back-side probing may be useful in identifying any defects in the semiconductor device before it is further processed, packaged or assembled with other devices.

As used herein, the term "substrate" refers to any electronic structure or device that comprises a conductive via, or through which it is desired to form a conductive via. By way of example and not limitation, substrates may include semiconductor dies, full or partial semiconductor wafers, semiconductor devices (e.g., memory devices, imaging devices, and electronic signal processors), circuit boards, and layers of semiconductor, polymer, ceramic, or metal materials, or a combination thereof.

To form a conductive via, a via may be formed through a substrate using any one of a variety of methods, including mechanical drilling, laser ablation, and wet (chemical) or dry (reactive ion) etching. As used herein, the term "via" refers to a hole or aperture that extends through a substrate, while the phrase "conductive via" refers to a via that is at least partially filled with an electrically conductive material to form an electrical pathway extending through the via. Furthermore, a "through wafer interconnect" or "TWI" is a particular type of conductive via that extends substantially entirely through a full or partial semiconductor wafer, or through a semiconductor device formed from such a full or partial semiconductor wafer.

Optionally, the walls of the substrate within the via may be coated with a dielectric material. The dielectric material may comprise, for example, an oxide, a nitride, a polymer, or a glass. Methods of depositing and otherwise forming such layers of dielectric material are known in the art and may vary depending on the type of material used for the substrate and for the dielectric layer. The via may then be at least partially filled with a conductive material to form a conductive via. As an example, the conductive material may be deposited on one or more surfaces of the substrate within the via using methods such as electrolytic plating, electroless plating, vacuum evaporation (chemical vapor deposition and variants), and sputtering (also termed physical vapor deposition). Additionally, the via may be substantially entirely filled with the conductive material. For example, a conductive or conductor-filled epoxy may be deposited into the via in flowable form and subsequently cured, or a solder paste may be deposited into the via and subjected to a reflow process.

After a conductive via has been formed through a substrate, the substrate may optionally be thinned, a redistribution layer may optionally be formed on one or more major surfaces of the substrate, and/or conductive bumps (i.e., solder balls or other conductive elements in the form of columns, pillars, studs, etc.) may optionally be formed or placed on conductive terminals on the substrate.

Examples of known methods for foiling conductive vias through substrates are found in, for example, U.S. Patent Application Publication No. 2007/0048994, published Mar. 1, 2007, now U.S. Pat. No. 7,517,798, issued Apr. 14, 2009, to Tuttle; U.S. Pat. No. 7,109,068, issued Sep. 19, 2006, to Akram et al.; and U.S. Patent Application Publication No. 2006/0289968, published Dec. 28, 2006, now U.S. Pat. No. 7,795,134, issued Sep. 14, 2010, to Sulfridge. The disclosure of each of the forgoing documents is incorporated herein in its entirety by reference.

There remains a need in the art for improved methods of forming conductive vias through substrates, and for forming conductive structures, such as redistribution layers, on such substrates.

DETAILED DESCRIPTION

Broadly, embodiments of the present invention include methods for forming conductive elements on and in substrates, and the resulting structures and assemblies. The conductive structures may include, for example, conductive vias extending through the substrates, as well as conductive pads, conductive traces, or both conductive pads and conductive traces on at least one major surface of a substrate. A layer of conductive material may be provided over at least one major surface of the substrate prior to forming vias through the substrate. Optionally, a temporary carrier may be secured to the layer of conductive material on a side thereof opposite the substrate prior to forming the vias into the substrate from the side thereof opposite the layer of conductive material. The vias may be formed through the substrate to the layer of conductive material.

Figure 1:
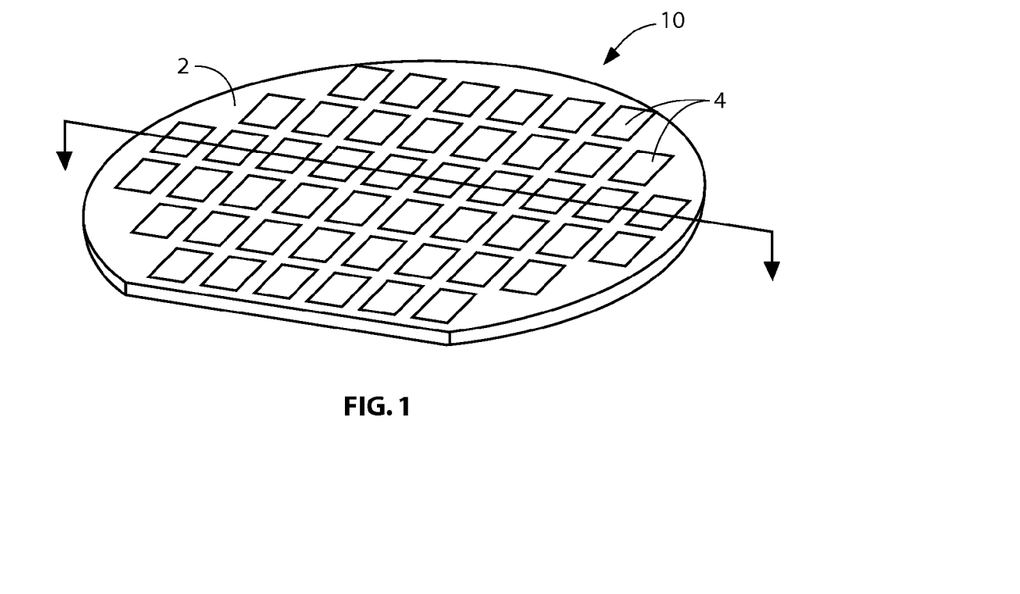
FIG. 1 depicts a semiconductor wafer through which conductive vias may be formed according to embodiments of the present invention.

FIG. 1 depicts an example of a workpiece 10 comprising a semiconductor wafer 2, in and on which a plurality of semiconductor devices 4 have been at least partially formed. The wafer 2 may be formed from a variety of materials, such as, for example, silicon, germanium, gallium arsenide, indium phosphide, or polysilicon. In additional embodiments, the wafer 2 may comprise a silicon-on-insulator (SOI)-type substrate such as, for example, a silicon-on-glass (SOG) substrate or a silicon-on-sapphire (SOS) substrate. It may be necessary or desirable to form one or more conductive vias through each of the semiconductor devices 4. Embodiments of methods of the present invention, which may be used for forming conductive vias through the semiconductor devices 4 shown in FIG. 1, are described in further detail below. In some embodiments, the conductive vias may be formed at the so-called "wafer scale" while the semiconductor devices 4 remain part of a wafer, such as the semiconductor wafer 2 shown in FIG. 1. In other embodiments, the conductive vias may be formed through the individual semiconductor devices 4 (e.g., semiconductor dies or packages) after they have been singulated from the semiconductor wafer 2.

Figure 2A:
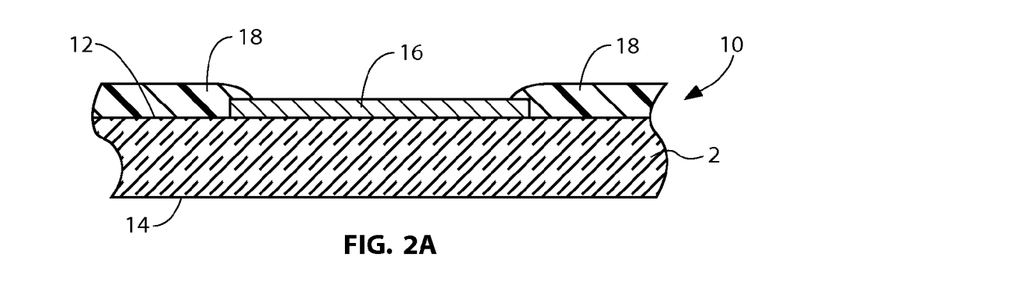
FIGS. 2A through 2K are enlarged partial cross-sectional side views of a workpiece and illustrate an embodiment of a method of the present invention that may be used to form a conductive via through a substrate, such as the semiconductor wafer shown in FIG. 1.

FIGS. 2A through 2K are enlarged partial cross-sectional side views of the workpiece 10 shown in FIG. 1. FIG. 2A depicts a portion of the workpiece 10 that includes a region of the semiconductor wafer 2 through which it is desired to form a conductive via. The wafer 2 has a first major surface 12 and an opposing second major surface 14. The wafer 2 may have structures formed on or in the first major surface 12. For example, a layer of conductive material may be formed on the first major surface 12 and the layer of conductive material may be patterned forming conductive pads 16. For another example, a passivation layer 18, conductive traces (not shown), transistors (not shown), capacitors (not shown), isolation regions (not shown), and other features may be formed in and on the first major surface 12 of the wafer 2.

The passivation layer 18 may comprise a dielectric material such as, for example, silicon oxide ($SiO_2$), silicon nitride ($Si_3N_4$), phosphosilicate glass (PSG), borosilicate glass (BSG), borophosphosilicate glass (BPSG), a polymer material, or any other material suitable for use as a passivation layer. The passivation layer 18 may be applied using, for example, conventional chemical vapor deposition (CVD) methods, physical vapor deposition (PVD) methods, spin-on methods, or any other method suitable for the particular type of passivation material used for the passivation layer 18.

Figure 2B:
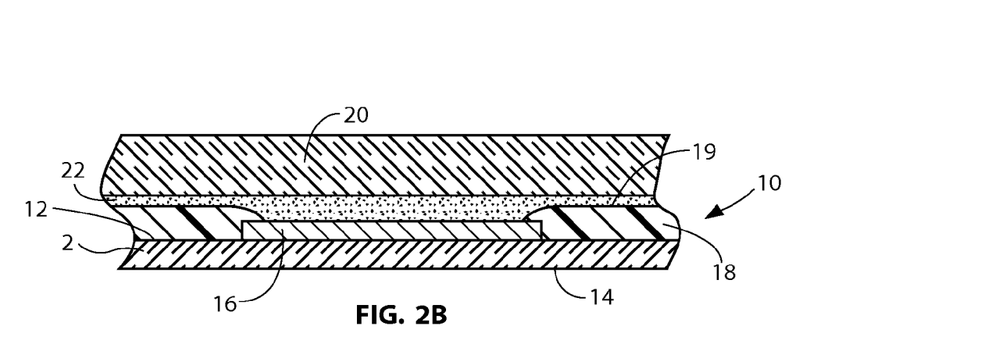

In some embodiments, the wafer 2 may be thinned prior to foiling conductive vias therethrough. Referring to FIG. 2B, the top surface 19 of the workpiece 10, which may in the case of a semiconductor substrate comprise the active surface, may be adhered to a temporary carrier 20 by means of an adhesive 22 to facilitate thinning of the wafer 2. The temporary carrier 20 may provide structural support and strength to the workpiece 10, and may facilitate the movement and handling of the workpiece 10 by processing equipment used to thin the semiconductor wafer 2. As used herein, the term "top" and other orientational terms are used merely for convenience and in the context of the views of the drawings, and are not limiting of an orientation of the articles described herein during processing or use.

The wafer 2 may be thinned by removing material from the second major surface 14 thereof, which may comprise a backside surface, by a process such as, for example, at least one of chemical etching, grinding, and chemical-mechanical polishing (CMP). As known in the art, CMP generally comprises agitating the second major surface 14 of the wafer 2 against a wetted polishing surface under controlled chemical, pressure, and temperature conditions to remove material from the second major surface 14 of the wafer 2. As a non-limiting example, the wafer 2 may have an initial thickness of approximately seven hundred and sixty microns (760 µm) and may be thinned using a CMP process to approximately eighty microns (80 µm).

The temporary carrier 20 may comprise a semiconductor wafer, a glass sheet, or another material that may provide structural support to the workpiece 10. In some embodiments, the temporary carrier 20 may comprise a material substantially identical to that of the wafer 2. Additionally, the temporary carrier 20 may comprise a material that exhibits a coefficient of thermal expansion (CTE) that is similar to (e.g., within about twenty percent (20%)) or that substantially matches a coefficient of thermal expansion (CTE) exhibited by the wafer 2. By using a temporary carrier 20 that exhibits the same or a similar coefficient of thermal expansion as the wafer 2, the assembly (i.e., the workpiece 10 and the temporary carrier 20) may be heated and/or cooled during processing and handling without damaging the workpiece 10 due to thermally induced stresses.

The temporary carrier 20 may be temporarily adhered to the top surface 19 of the workpiece 10 using the adhesive 22. For example, the adhesive 22 may comprise a thermoplastic polymer material that will melt to a pliable state when heated above a threshold temperature (i.e., the glass transition temperature of the material). The heated and pliable thermoplastic may be sandwiched between the temporary carrier 20 and the top surface 19 of the workpiece 10, and may substantially conform to the top surface 19 of the workpiece 10. The thermoplastic material then may be cooled to a temperature below the threshold temperature to cause the material to solidify and form an adhesive bond between the temporary carrier 20 and the top surface 19 of the workpiece 10.

In additional embodiments, the wafer 2 may be thinned without using the temporary carrier 20.

Figure 2C:
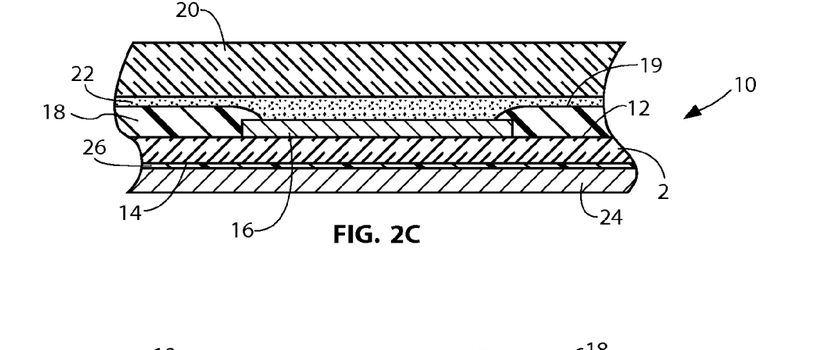

Prior to forming one or more conductive vias through the wafer 2, a redistribution layer, or a layer of conductive material 24 from which such a redistribution layer may be formed, may be formed on or over at least a portion of the second major surface 14 of the wafer 2, as shown in FIG. 2C.

Optionally, a layer of dielectric material 26 may be formed on the second major surface 14 of the wafer 2, and the layer of conductive material 24 may be formed on the layer of dielectric material 26. The layer of dielectric material 26 may comprise, for example, a pulsed deposition layer (PDL) comprising aluminum-rich oxide, low silane oxide (LSO), a PARYLENE™ polymer such as that which is available from Specialty Coating Systems, silicon dioxide ($SiO_2$), aluminum oxide ($Al_2O_3$), an organic polymeric material suitable for passivation purposes such as polybenzoxazole (PBO) or benzocyclobutene (BCB), or combinations of any such materials. Other dielectric materials that may be used as the layer of dielectric material 26 include tetraethyl orthosilicate (TEOS), spin-on glass, thermal oxide, silicon nitride, silicon oxynitride, a glass (i.e., borophosphosilicate glass (BPSG), phosphosilicate glass, or borosilicate glass), or any other suitable dielectric material known in the art. Methods of depositing such layer of dielectric material 26 are known by those of ordinary skill in the art and vary depending on the type of material used for the layer of dielectric material 26. The layer of dielectric material 26 may prevent shorting between the layer of conductive material 24 and conductive or semiconductive elements within the wafer 2.

In some embodiments, the layer of conductive material 24 may comprise, without limitation, titanium (Ti), polysilicon (Si), palladium (Pd), tin (Sn), tantalum (Ta), tungsten (W), cobalt (Co), copper (Cu), silver (Ag), aluminum (Al), iridium (Ir), gold (Au), molybdenum (Mo), platinum (Pt), nickel-phosphorus (NiP), palladium-phosphorus (Pd—P), cobalt-phosphorus (Co—P), a cobalt-tungsten-phosphorous (Co—W—P) alloy, other alloys of any of the foregoing metals, a conductive polymer or conductive material entrained in a polymer (i.e., conductive or conductor-filled epoxy), and mixtures thereof.

In additional embodiments, the layer of conductive material 24 itself may comprise a plurality of layers, which may include, for example, a plating-attractive coating (PAC) or another type of seed layer that is formed over the layer of dielectric material 26 to enhance deposition of a bulk layer of conductive material thereon, the seed layer and the bulk layer together forming the layer of conductive material 24. For instance, titanium nitride (TiN) may be formed over the layer of dielectric material 26 using chemical vapor deposition (CVD) techniques, and the titanium nitride may be used as a PAC for a plating process such as, for example, electroless or electrolytic plating used to form the layer of conductive material 24.

Other processes that may be used to deposit materials used to form the layer of conductive material 24 include, for example, metalorganic chemical vapor deposition (MOCVD), physical vapor deposition (PVD), plasma-enhanced chemical vapor deposition (PECVD), vacuum evaporation, and sputtering.

The layer of conductive material 24 may be formed with the temporary carrier 20 adhered to the top surface 19 of the workpiece 10, or may be formed without the temporary carrier 20 adhered to the top surface 19 of the workpiece 10.

Figure 2D:
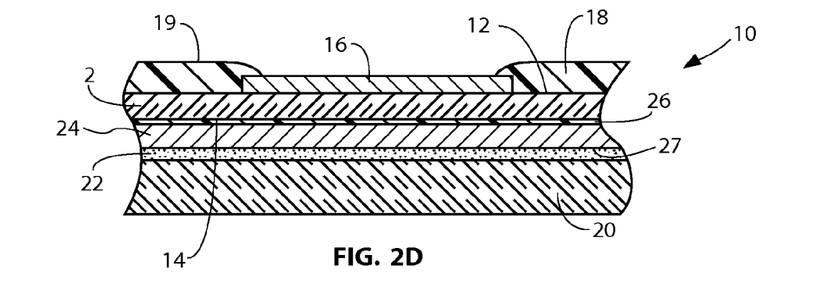

After forming the layer of conductive material 24 over the second major surface 14 of the wafer 2, the temporary carrier 20 may be moved from the top surface 19 of the workpiece 10 to the bottom surface 27 of the workpiece 10, as shown in FIG. 2D, or another temporary carrier 20 may be employed. To remove the temporary carrier 20 from the top surface 19 of the workpiece 10, the adhesive 22 of the temporary carrier 20 may be released from the top surface 19 of the workpiece 10 (e.g., by heating the adhesive 22). Adhesive 22 then may be used to temporarily adhere the temporary carrier 20 to the bottom surface 27 of the workpiece 10 in substantially the same manner previously described for adhering the temporary carrier 20 to the top surface 19 of the workpiece 10.

Figure 2E:
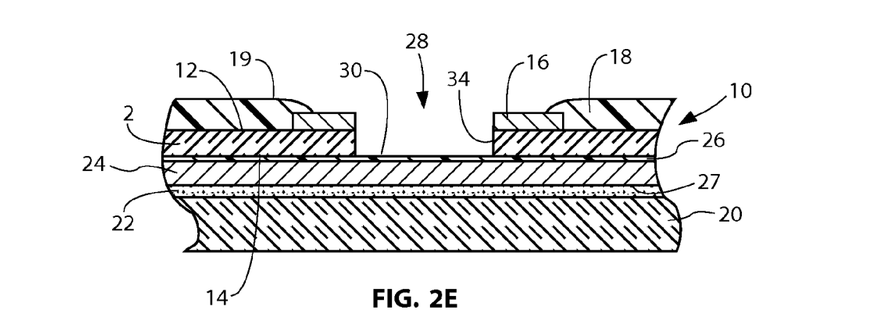

FIG. 2E depicts the wafer 2 with a via 28 formed therein. As shown in FIG. 2E, the via 28 may extend completely through the conductive pad 16 and the wafer 2 to the layer of dielectric material 26, such that the layer of dielectric material 26 is exposed at, and forms the bottom surface 30 of, the via 28. In additional embodiments, the via 28 may also extend through the layer of dielectric material 26 to the layer of conductive material 24, such that the layer of conductive material 24 is exposed at, and forms the bottom surface 30 of, the via 28.

The via 28 may be formed through the conductive pad 16 and the wafer 2 (and, optionally, through the layer of dielectric material 26) from the exposed surface of the conductive pad 16 on the top surface 19 of the workpiece 10 shown in FIG. 2E. By way of example and not limitation, a mask layer may be deposited over the top surface 19 of the workpiece 10 shown in FIG. 2E, and the mask layer may be patterned using a conventional photolithography process to form an aperture extending through the mask layer over the conductive pad 16 at the location at which it is desired to form the via 28. An etching process (e.g., a wet chemical etching process or a dry reactive ion etching process) then may be used to etch through the conductive pad 16 and the wafer 2 (and, optionally, through the layer of dielectric material 26). One suitable wet chemical etchant that may be used to form the via 28 comprises a mixture of nitric acid and hydrofluoric (HF) acid in deionized (DI) water.

In additional embodiments, the via 28 may be formed by mechanical drilling or laser ablation. After forming the via 28, the via 28 optionally may be subjected to a cleaning process to remove any unwanted reactants or impurities from the workpiece 10, particularly in the case of laser ablation, portions of the substrate material adjacent the via in the so-called "heat-affected zone," or "HAZ," of the substrate. One suitable cleaning solvent for such purpose is a solution comprising about 6% tetramethyl ammonium hydroxide (TMAH) in propylene glycol.

Figure 2F:
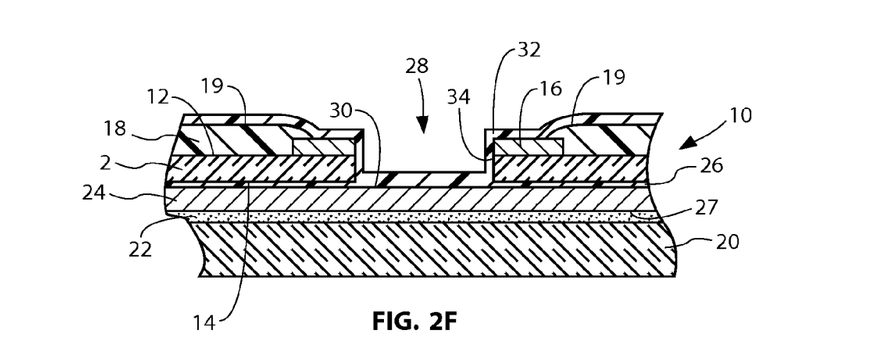

In some embodiments, sidewalls 34 of the workpiece 10 within the via 28 may be electrically insulated by applying a dielectric material thereto. Referring to FIG. 2F, a layer of dielectric material 32 may be formed on the top surface 19 of the workpiece 10 and the exposed surfaces of the workpiece 10 within the via 28, including the sidewalls 34 and the bottom surface 30. By way of example and not limitation, the layer of dielectric material 32 may comprise an oxide material, a nitride material, or a polymer material, and be fainted in a similar manner to that previously described in relation to the layer of dielectric material 26 with reference to FIG. 2C.

Figure 2G:
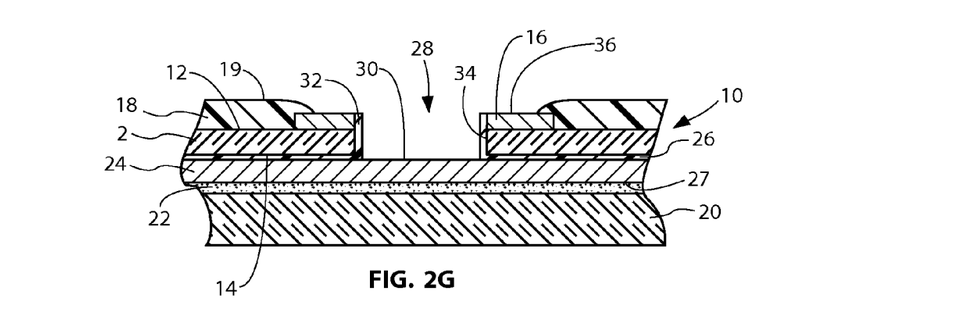

As shown in FIG. 2G, an anisotropic etching process (often referred to as a "spacer" etching process) may be used to selectively remove the generally horizontally extending portions of the layer of dielectric material 32 from the workpiece 10, including the portion extending over the top surface 19 of the workpiece 10 and the bottom surface 30 within the via 28, but leaving behind the generally vertically extending portions of the layer of dielectric material 32 on the sidewalls 34 within the via 28. After such an etching process, dielectric material 32 may be disposed on the sidewalls 34 within the via 28. The bottom surface 30 within the via 28 may be substantially free of any dielectric material, and the layer of conductive material 24 may be exposed within the via 28 and may form the bottom surface 30 within the via 28. Additionally, electrically conductive structures, such as the conductive pads 16, may have at least a portion of their upper contact surface 36 exposed and substantially free of dielectric material.

Figure 2H:
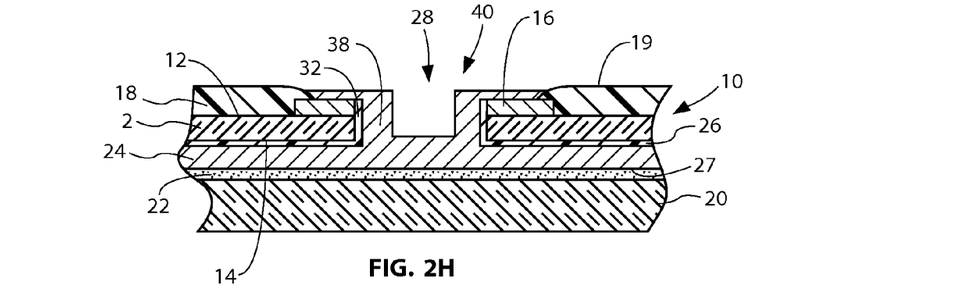

Referring to FIG. 2H, a conductive material 38 may be deposited within the via 28 to form a conductive via 40 that provides electrical communication between the conductive pad 16 on the first major surface 12 of the wafer 2 and the layer of conductive material 24 on the second major surface 14 of the wafer 2. As shown in FIG. 2H, in some embodiments, the conductive material 38 may not entirely fill the via 28, and may be disposed on the sidewalls 34 within the via 28. In additional embodiments, however, the via 28 may be substantially entirely filled with the conductive material 38. In some embodiments, the conductive material 38 may extend at least partially over the upper contact surface 36 of the conductive pad 16 adjacent the conductive via 40.

In some embodiments, conductive material 38 may be deposited within the via 28 using, for example, chemical vapor deposition (CVD) processes, physical vapor deposition (PVD) processes, atomic layer deposition (ALD) processes, electroplating processes, electroless plating processes, or any combination of the above processes. In additional embodiments, the conductive material 38 may be deposited in the via 28 as a paste (e.g., a solder paste), and the paste within the via 28 then may be subjected to a reflow process wherein the paste is heated, and conductive material 38 therein is melted and subsequently allowed to cool and to solidify within the via 28. In yet other embodiments, the conductive material 38 may comprise a conductive or conductor-filled polymer material (e.g., epoxy). Such a material may be provided within the via 28 in an uncured, flowable liquid or gel state, after which the uncured polymer may be cured (e.g., using heat, electromagnetic radiation, or the addition of chemical reactants or catalysts) to solidify the material within the via 28 and form the conductive via 40. Furthermore, in some embodiments, the conductive material 38 may have a multi-layer structure comprising a plurality of layers of conductive material. For example, the conductive material 38 may comprise a first layer of conductive material deposited within the via 28 using an electroless plating technique, and a second layer of conductive material deposited over the first layer of conductive material using an electroplating technique. As another example, the conductive material 38 may comprise at least one of a layer of barrier material, a layer of adhesion material, and a noble metal cap layer, in addition to a bulk conductive material used to form the conductive via 40. As used herein, the term "barrier material" means any material selected to prevent the migration of matter (e.g., atoms, molecules, etc.) through the material. As used herein, the term "adhesion material" means any material selected to facilitate adhesion of a first material immediately adjacent a first surface of the material to a second material immediately adjacent another surface of the material.

After forming the conductive via 40 in the workpiece 10 in a manner that provides electrical communication through the wafer 2 between the conductive pad 16 and the layer of conductive material 24, the layer of conductive material 24 may be selectively patterned (e.g., blanket deposited and removed from selected regions, or deposited on only selected regions) to form conductive pads, conductive traces, or both conductive pads and conductive traces from the layer of conductive material 24, as described in further detail below.

Figure 2I:
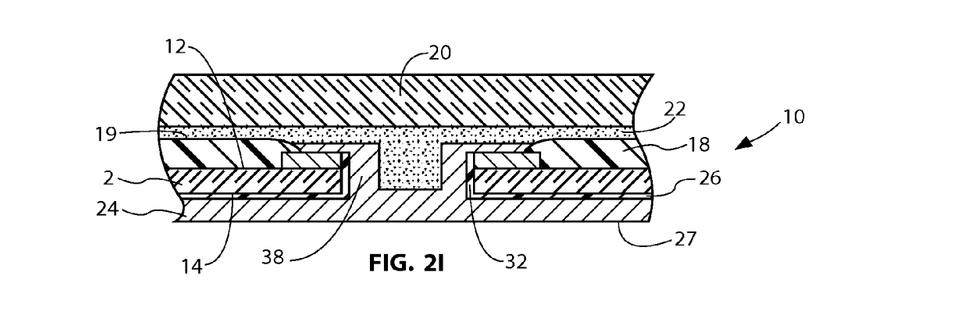

Referring to FIG. 2I, in some embodiments, the temporary carrier 20 may be removed from the bottom surface 27 of the workpiece 10 to expose the layer of conductive material 24. Optionally, that same temporary carrier 20 or a different temporary carrier 20 may be adhered to the top surface 19 of the workpiece 10 to facilitate handling and processing of the workpiece 10 as the layer of conductive material 24 is selectively patterned.

Figure 2J:
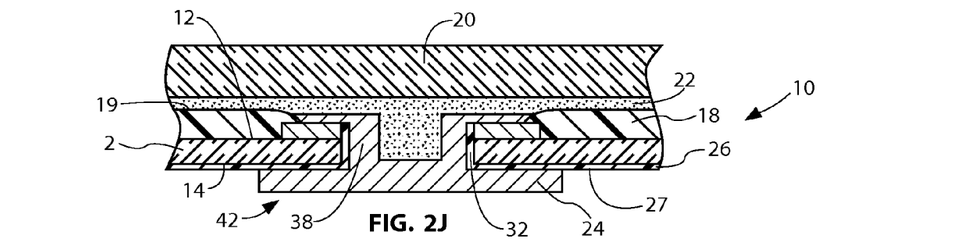

FIG. 2J depicts the workpiece 10 after the layer of conductive material 24 has been selectively patterned to form a conductive pad 42 directly over (i.e., vertically aligned with) each of the conductive vias 40. As previously mentioned, however, in additional embodiments, the layer of conductive material 24 may be selectively patterned to form, for example, conductive pads, conductive traces, or both conductive pads and conductive traces comprising a redistribution layer (RDL) from the layer of conductive material 24. By way of example and not limitation, the layer of conductive material 24 may be selectively patterned using a masking and etching process, as known in the art.

Figure 2K:
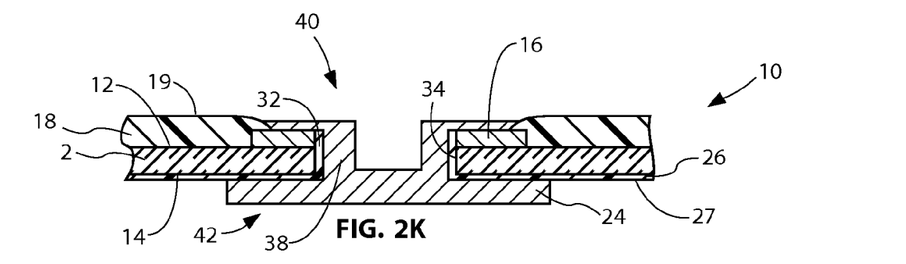

FIG. 2K depicts the workpiece 10 in which the conductive via 40 has been Ruined, and the optional temporary carrier 20 (FIG. 2J) has been removed.

Although not described herein, additional processes may be performed on the workpiece 10 as necessary or desirable. For example, conductive solder bumps (e.g., solder balls) or other conductive or conductor-filled elements (see FIG. 5) may be formed on at least some of the conductive pads 42 and/or the conductive pads 16, individual semiconductor devices may be singulated from the wafer 2, and the individual semiconductor devices may be packaged. If the conductive material 38 of the conductive via 40 does not completely fill the via 28, the remaining void may be filled with a polymer or other dielectric material.

Additional embodiments of methods of the present invention, in which the layer of conductive material 24 is selectively patterned prior to formation of the conductive via 40, are described below with reference to FIGS. 3A through 3H.

Figure 3A:
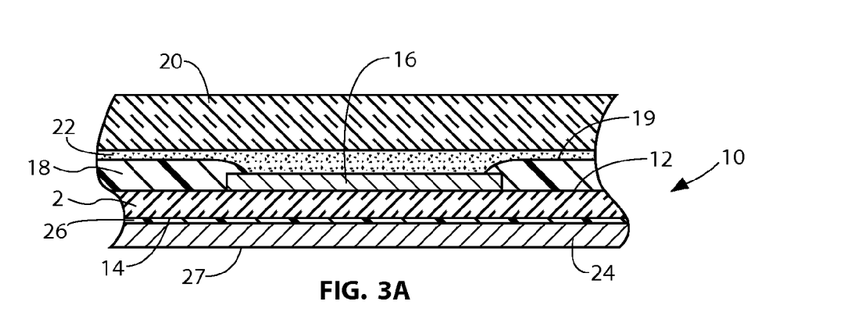
FIGS. 3A through 3H are enlarged partial cross-sectional side views of a workpiece and illustrate another embodiment of a method of the present invention that may be used to form conductive vias through a substrate.

As shown in FIG. 3A, a workpiece 10 may be provided that is substantially identical to that shown in FIG. 2C using methods such as those previously described herein with reference to FIGS. 2A through 2C. As shown in FIG. 3A, the workpiece 10 includes a passivation layer 18 and a plurality of conductive pads 16 over (e.g., on) a first major surface 12 of a wafer 2 or any other type of substrate. Additionally, the workpiece 10 may comprise a layer of dielectric material 26 and a layer of conductive material 24 over (e.g., on) a second major surface 14 of the wafer 2 or other type of substrate. Optionally, a temporary carrier 20 may be adhered to the top surface 19 of the workpiece 10 (as shown in FIG. 3A) using an adhesive 22 to facilitate handling and processing of the workpiece 10, as previously described herein.

Figure 3B:
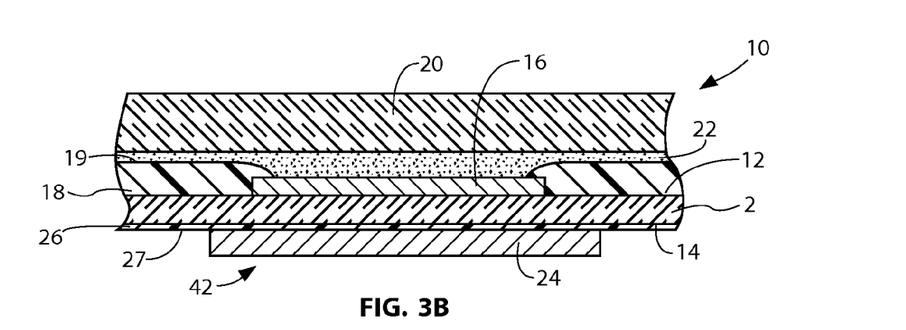

Referring to FIG. 3B, the layer of conductive material 24 may be selectively patterned (e.g., blanket deposited and removed from selected regions, or deposited on only selected regions) to form conductive pads, conductive traces, or both conductive pads and conductive traces from the layer of conductive material 24. By way of example and not limitation, the layer of conductive material 24 may be selectively patterned to form an RDL comprising a plurality of conductive traces each extending from a conductive via 40 (FIG. 3G) to a conductive pad 42 at a location over the second major surface 14 of the wafer 2 remote from the respective conductive via 40.

Patterning the layer of conductive material 24 prior to forming the conductive via 40 (FIG. 3G) in the wafer 2 may reduce the number of times that the temporary carrier 20 is transferred between the top surface 19 and the bottom surface 27 of the workpiece 10.

Figure 3C:
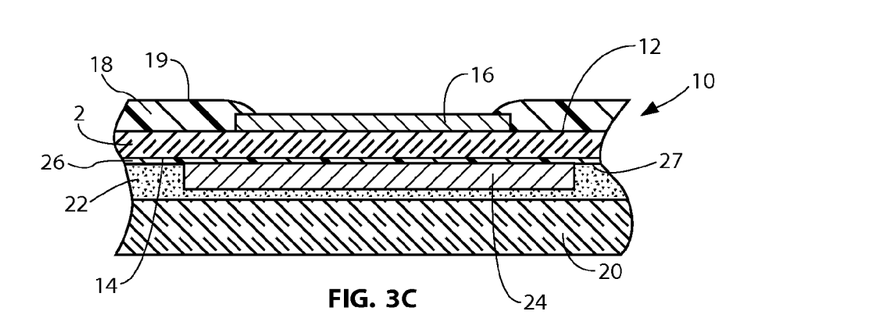

As shown in FIG. 3C, after selectively patterning the layer of conductive material 24, the temporary carrier 20 may be transferred to the bottom surface 27 of the workpiece 10 using an adhesive 22 to facilitate handling and processing of the workpiece 10 as conductive vias 40 (FIG. 3G) are formed therein.

Figure 3D:
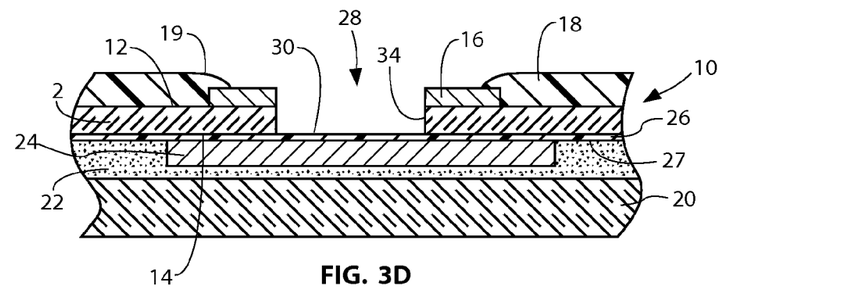
Figure 3E:
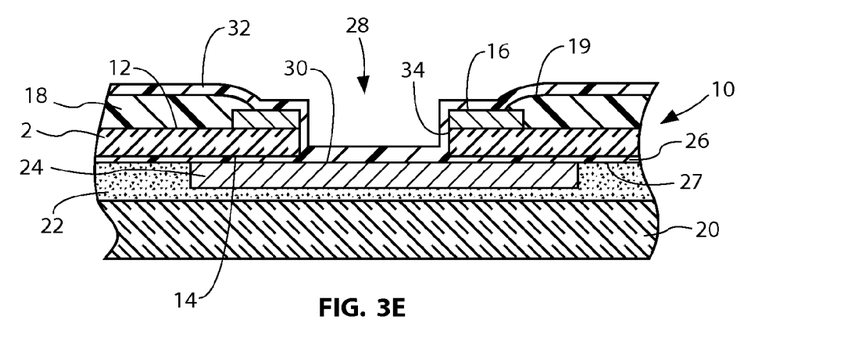
Figure 3F:
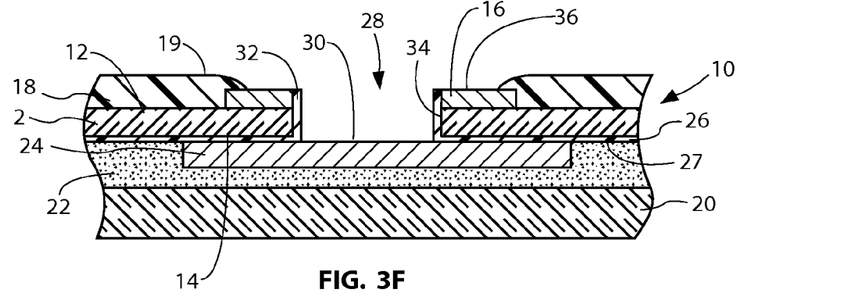
Figure 3G:
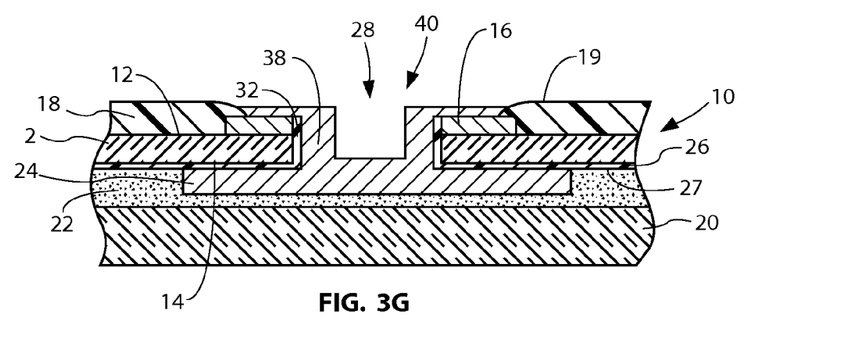
Figure 3H:
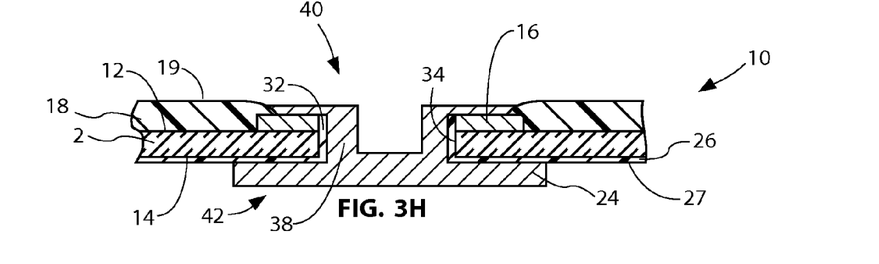

As illustrated in FIG. 3D, a via 28 may be formed through the wafer 2, as previously described in relation to FIG. 2E. As depicted in FIG. 3E, a layer of dielectric material 32 may be deposited on the top surface 19 of the workpiece 10, including within the via 28, as previously described in relation to FIG. 2F. As shown in FIG. 3F, an anisotropic etching process, such as a reactive ion etch, may be used to selectively remove the generally horizontally extending portions of the layer of dielectric material 32 from the workpiece 10, including the portion extending over the top surface 19 of the workpiece 10 and the bottom surface 30 within the via 28, but leaving behind the generally vertically extending portions of the layer of dielectric material 32 on the sidewalls 34 within the via 28, as previously described in relation to FIG. 2G. Referring to FIG. 3G, conductive material 38 may be deposited within the via 28 to form a conductive via 40, as previously described in relation to FIG. 2H. The temporary carrier 20 may be removed from the bottom surface 27 of the workpiece 10 as shown in FIG. 3H.

As mentioned previously herein, additional processes may be performed on the workpiece 10 as necessary or desirable. For example, conductive solder bumps (e.g., solder balls) or other conductive or conductor-filled elements (see FIG. 5) may be formed on at least some of the conductive pads 42 and/or the conductive pads 16, individual semiconductor devices may be singulated from the wafer 2, and the individual semiconductor devices may be packaged.

Although the embodiments of methods of the present invention have been described hereinabove with reference to a substrate comprising a wafer 2, embodiments of the present invention are equally applicable to, and encompass, other types of substrates.

Figure 4:
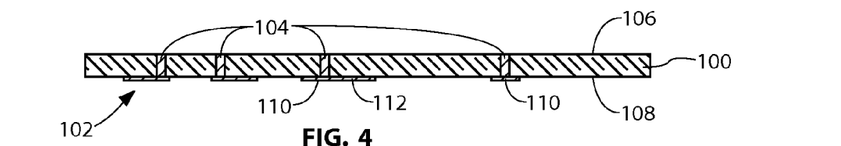
FIG. 4 depicts a cross-sectional view of an embodiment of the present invention that includes a circuit board having a redistribution layer formed on a major surface of a layer of substrate material and a plurality of conductive vias extending through the substrate material.

For example, FIG. 4 depicts an embodiment of the present invention comprising a circuit board 100. As shown in FIG. 4, the circuit board 100 has a first major surface 106 and an opposing, second major surface 108. A conductive layer 102 may be formed on or over at least the second major surface 108. The conductive layer 102 may include conductive pads 110, conductive traces 112, or both conductive pads 110 and conductive traces 112, as shown in FIG. 4. Conductive vias 104 may extend through the circuit board 100 and communicate electrically with conductive pads 110 and/or conductive traces 112 of the conductive layer 102. The conductive layer 102 and the conductive vias 104 may be &limed on and in the circuit board 100 using the methods previously described herein with reference to FIGS. 2A through 2K and FIGS. 3A through 3H.

By way of example and not limitation, the circuit board 100 may comprise a motherboard of a computer system or other electronic device. As another non-limiting example, the circuit board 100 may comprise an interposer configured to be disposed between a semiconductor device (e.g., a memory device, an imaging device, or an electronic signal processor) and a higher-level substrate (e.g., a motherboard). In such embodiments, the conductive layer 102 may comprise a redistribution layer.

Figure 5:
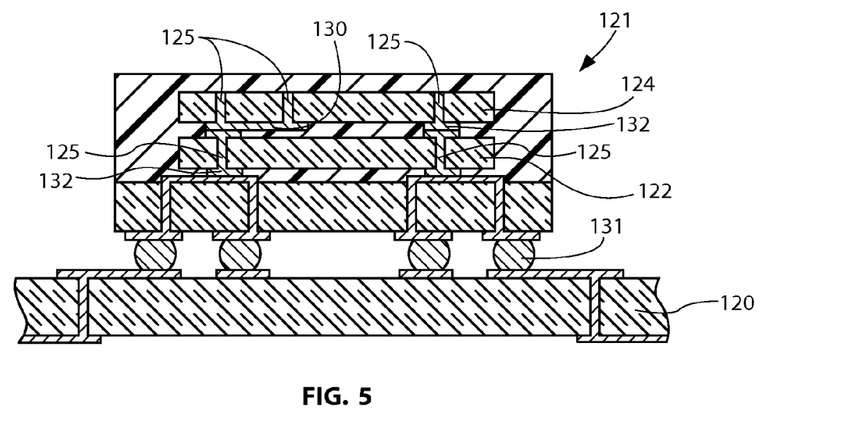
FIG. 5 depicts a cross-sectional view of an embodiment of the present invention that includes a multi-chip module comprising a plurality of semiconductor devices, each of which includes a plurality of conductive vias extending therethrough.

FIG. 5 illustrates yet another embodiment of the present invention comprising a multi-chip module 121. As used herein, the term "multi-chip module" means a semiconductor device comprising two or more individual semiconductor devices, each comprising an integrated circuit, that have been packaged into a single module. In the embodiment shown in FIG. 5, the multi-chip module 121 comprises a first semiconductor device 122 and a second semiconductor device 124. The multi-chip module 121 is illustrated in FIG. 5 as being structurally and electrically coupled to a higher-level substrate, such as a circuit board 120. As shown, such coupling may be effected, as a non-limiting example, by conductive elements 131 in the form of solder or a conductive or conductor-filled resin. In some embodiments, the first semiconductor device 122 and the second semiconductor device 124 may each comprise a memory device. In additional embodiments, one or both of the first semiconductor device 122 and the second semiconductor device 124 may comprise an electronic signal processor, an imaging device, an application specific integrated circuit (ASIC), or any other type of semiconductor device. As shown in FIG. 5, each of the first semiconductor device 122 and the second semiconductor device 124 may comprise a plurality of conductive vias 125, as well as conductive traces 130 and/or conductive pads 132. The conductive vias 125 and the conductive traces 130 and/or conductive pads 132 may be formed on and in the first semiconductor device 122 and the second semiconductor device 124 (before the semiconductor devices 122, 124 are assembled together to form the multi-chip module 121) using the methods previously described herein with reference to FIGS. 2A through 2K and FIGS. 3A through 3H.

The methods previously described herein may be used to form conductive vias and conductive layers that include, for example, conductive traces and/or conductive vias on and in many other types of substrates used in electronic devices and systems.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims that follow.

What is claimed is:

1. A method for forming conductive elements on and in a substrate, the method comprising:
   at least substantially entirely covering a first major surface of a substrate with a conductive material; and
   subsequently forming a via through the substrate from a second major surface of the substrate opposing the first major surface to the conductive material.

2. The method of claim 1, further comprising forming the via to comprise a bottom surface comprising the conductive material.

3. The method of claim 1, further comprising forming a dielectric material over sidewalls defining the via.

4. The method of claim 3, wherein forming a dielectric material over sidewalls defining the via comprises removing a portion of the dielectric material from within the via and over the conductive material.

5. The method of claim 4, wherein removing a portion of the dielectric material from within the via and over the conductive material comprises exposing a portion of the conductive material within the via.

6. The method of claim 1, further comprising forming another conductive material within the via in contact with the conductive material.

7. The method of claim 1, further comprising selectively removing a portion of the conductive material from the first major surface of the substrate.

8. The method of claim 7, wherein selectively removing a portion of the conductive material from the first major surface of the substrate comprises selectively removing the portion of the conductive material from the first major surface of the substrate after forming the via through the substrate.

9. The method of claim 7, wherein selectively removing a portion of the conductive material from the first major surface of the substrate comprises forming at least one of a conductive pad and a conductive trace.

10. The method of claim 1, wherein subsequently forming a via through the substrate comprises forming the via through a conductive pad on the second major surface of the substrate.

11. A method of forming a multi-chip module, the method comprising:
    forming a first conductive via in a first semiconductor device, comprising:
       at least substantially entirely covering a first major surface of the first semiconductor device with a first conductive material;
       subsequently forming a first via through the first semiconductor device from a second major surface of the first semiconductor device opposing the first major surface of the first semiconductor device to the first conductive material; and
       forming a second conductive material in the first via to form the first conductive via;
    forming a second conductive via in a second semiconductor device, comprising:
       at least substantially entirely covering a first major surface of the second semiconductor device with a third conductive material;
       subsequently forming a second via through the first semiconductor device from a second major surface of the second semiconductor device opposing the first major surface of the second semiconductor device to the third conductive material; and
       forming a fourth conductive material in the second via to form the second conductive via; and
    electrically coupling the first conductive via to the second conductive via.

12. The method of claim 11, further comprising electrically coupling the first semiconductor device to a substrate.

13. The method of claim 12, wherein electrically coupling the first semiconductor device to a substrate comprises electrically coupling the first semiconductor device to a circuit board.

14. The method of claim 12, wherein electrically coupling the first semiconductor device to a substrate comprises electrically coupling the first semiconductor device to the substrate with at least one of solder and a conductive resin.

15. The method of claim 11, wherein forming a first conductive via in a first semiconductor device comprises forming the first conductive via in a memory device.

16. The method of claim 11, wherein forming a first conductive via in a first semiconductor device comprises forming the conductive via in one of an electronic signal processor, an imaging device, and an application specific integrated circuit.

17. The method of claim 11, wherein forming a first via through the first semiconductor device comprises forming the first via to comprise a bottom surface comprising the first conductive material.

18. The method of claim 11, wherein forming a first conductive via in a first semiconductor device further comprises selectively removing a portion of the first conductive material from the first major surface of the first semiconductor device.

19. The method of claim 18, wherein selectively removing a portion of the first conductive material from the first major surface of the first semiconductor device comprises forming at least one of a conductive trace and a conductive pad from the first conductive material.

20. The method of claim 11, wherein forming a first conductive via in a first semiconductor device and forming a second conductive via in a second semiconductor device comprise forming the first and second conductive vias in a semiconductor wafer.

* * * * *